US006833618B2

(12) United States Patent
Ono et al.

(10) Patent No.: US 6,833,618 B2
(45) Date of Patent: Dec. 21, 2004

(54) MEMORY SYSTEM WITH A SOCKET HAVING SOCKET PINS FOR MOUNTING MEMORY MODULES

(75) Inventors: Takao Ono, Koganei (JP); Hironori Iwasaki, Sagamihara (JP); Mitsuya Tanaka, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 110 days.

(21) Appl. No.: 09/964,474

(22) Filed: Sep. 28, 2001

(65) Prior Publication Data

US 2002/0041020 A1 Apr. 11, 2002

(30) Foreign Application Priority Data

Oct. 5, 2000 (JP) ........................................ 2000-305633

(51) Int. Cl.$^7$ ............................................. H01L 23/34
(52) U.S. Cl. ...................... 257/726; 257/727; 257/730; 257/785
(58) Field of Search ................................. 361/728, 729, 361/736, 737, 740, 748, 752, 759; 257/678, 685, 686, 690, 692–695, 723, 724, 726, 727, 730, 734, 773, 785, 786; 439/59–62, 326–329, 629–637

(56) References Cited

U.S. PATENT DOCUMENTS

| | | | | |
|---|---|---|---|---|
| 4,725,250 A | * | 2/1988 | Kuhn et al. .................. 439/629 |
| 4,756,694 A | * | 7/1988 | Billman et al. ................ 439/61 |
| 5,191,404 A | | 3/1993 | Wu ............................. 257/724 |
| 5,198,965 A | * | 3/1993 | Curtis et al. ................. 361/717 |
| 5,210,682 A | * | 5/1993 | Takashima ................... 361/744 |
| 5,396,102 A | * | 3/1995 | Toshio et al. ................ 257/723 |
| 5,530,623 A | * | 6/1996 | Sanwo et al. ................ 361/788 |
| 5,592,632 A | * | 1/1997 | Leung et al. ................ 710/316 |
| 5,613,077 A | * | 3/1997 | Leung et al. ................ 710/305 |
| 5,695,353 A | * | 12/1997 | Sakata et al. ................ 439/326 |
| 5,966,293 A | * | 10/1999 | Obermaier et al. ......... 361/735 |
| 6,392,897 B1 | * | 5/2002 | Nakase et al. .............. 361/785 |
| 6,493,250 B2 | * | 12/2002 | Halbert et al. ................ 365/63 |
| 6,507,496 B2 | * | 1/2003 | Levy et al. .................. 361/760 |

FOREIGN PATENT DOCUMENTS

| | | | | |
|---|---|---|---|---|
| JP | 02288292 A | * | 11/1990 | ............ H05K/1/18 |
| JP | 8-314800 | | 11/1996 | |
| JP | 10-3971 | | 1/1998 | |
| JP | 10-335546 | | 12/1998 | |
| JP | 11-40294 | | 2/1999 | |

* cited by examiner

*Primary Examiner*—Alonzo Chambliss
(74) *Attorney, Agent, or Firm*—Mattingly, Stanger & Malur, P.C.

(57) ABSTRACT

The invention provides a memory system that allows connection of a memory controller to each of plural memory modules in an equal distance. The memory system includes a memory controller, three memory modules, a single socket which the three memory modules can be inserted into and pulled out from, and a mother board on which the memory controller and the socket are mounted, etc. And, the memory controller and each of the memory modules are connected in an equal distance through the socket pins of the socket that are branched from bus wirings on the mother board. The socket is furnished with three sets of the plural socket pins in a radial form, in correspondence with each of the memory modules. The socket has two types of structures: one has three module-board contacts for one board-bus connection, and the other has one module-board contact for one board-bus connection.

25 Claims, 13 Drawing Sheets

MEMORY SYSTEM WITH A SOCKET HAVING SOCKET PINS FOR MOUNTING MEMORY MODULES

BACKGROUND OF THE INVENTION

The present invention relates to a technique of mounting plural memory modules, specifically to a technique effective for use in a memory system that mounts memory modules on a mother board through sockets and connects each of the memory modules with a memory controller in an equal distance.

The techniques relating to sockets or connectors for memory modules are disclosed, for example, in the Japanese Published Unexamined Patent Publication No. Hei 10 (1998)-3971, Hei 11(1999)-40294, Hei 10(1998)-335546, Hei 8(1996)-314800, Hei 4(1992)-144160 which corresponds to U.S. Patent Publication No. 5,191,404, and so forth.

The Japanese Published Unexamined Patent Publication No.Hei 10(1998)-3971 discloses a technique that when the wirings between the sockets for memory modules are lengthy, the wirings are easily influenced by noises from adjacent signal wirings, and the common signal is directly short-circuited between the sockets by using a short-circuiting plate to shorten the length of the wirings, thereby enhancing the immunity to noises.

The Japanese Published Unexamined Patent Publication No.Hei 11(1999)-40294 discloses a technique that reduces the number of through holes and contacts to be formed on a printed circuit board by using a common bar as a common signal line between the sockets for memory modules, to thereby achieve simplification of the connector structure and reduction of the mounting cost.

The Japanese Published Unexamined Patent Publication No.Hei 10(1998)-335546 discloses a technique that achieves the electrical connection and mechanical support of modules only by a socket member having plural connections in pursuit of a size reduction of the socket that mounts plural modules. The technique achieves the compatibility of the mechanical holding power of the socket member and the overcoat plating facility on the electric contacts of the socket member, by shifting the positions of the contacts of external connection terminals on the front and back sides of the module.

The Japanese Published Unexamined Patent Publication No.Hei 8(1996)-314800 discloses a module for connecting memory modules that possesses plural connection sockets in order to connect the memory modules whose number exceeds the number of the sockets for the memory modules in a computer.

The Japanese Published Unexamined Patent Publication No.Hei 4(1992)-144160 discloses a memory array mechanism that connects a multi-layer board having memory modules mounted thereon as a mutual connection member to the module board so as to face each other with a narrow gap through edge clips.

SUMMARY OF THE INVENTION

In a memory system mounting plural memory modules, the influence given to signal waveforms (deformations of waveforms by reflected waves due to the impedance mismatching) by the length of bus lines on a mother board and the number of the sockets for the memory modules on the bus lines has been an ignorable factor in a synchronous DRAM of which clock frequency exceeds 133 MHz.

Especially, in a bus having multiple slots, the degree of influence to the waveforms that the reflected waves give at the termination greatly differs at the socket near side or at the socket far side, which makes the timing design difficult. And, as the number of the sockets increases, the length of the bus wiring becomes longer, and the wiring capacity increases, which makes it unfit for a high speed operation. Therefore, a shorter bus wiring with a shorter distance between the sockets in addition will achieve a better characteristic.

Accordingly, in this type of memory system, it is essential to design the bus wirings for the memory modules as shorter as possible to comply with a higher speed operation. However, the length of the bus wiring is basically determined by the larger one of the thickness of the socket and that of the module and the number of the socket. As to the thickness of the module, the maximum thickness is settled by JEDEC, and as the result, if the specifications are the same, the widths of the buses will be virtually the same in any products.

Now, the inventor clarified the followings, through the examination of the memory system that mounts the plural memory modules as mentioned above. The technique of the memory system that the inventor examined will be discussed with reference to FIG. 12 illustrating the structure of the memory system as the premise of the invention, FIG. 13 illustrating the signal system of the memory system, and FIG. 14 (a), FIG. 14 (b) illustrating the signal waveforms that the memory modules receive.

As shown in FIG. 12, in the memory system, for example, a memory controller 101 is directly mounted on a mother board 108, and three memory modules 102 to 104 each having memory IC are mounted in parallel on the mother board 108 through sockets 105 to 107 each having plural socket pins. By way of the bus wirings on the mother board 108, each of the memory modules 102 to 104 is connected electrically to the memory controller 101 through the socket pins of each of the sockets 105 to 107.

In this type of the memory system, from the viewpoint of pursuing a high speed, the influence by the length of the bus wiring becomes ignorable; however, in the parallel arrangement of the memory modules 102 to 104 as shown in FIG. 12, there is a limit on the shortening of the bus wiring, from the thickness of the memory modules 102 to 104 or that of the sockets 105 to 107. Further, it is conceivable that the influences by the reflected waves being different depending on the positions of the sockets 105 to 107 (=bus wiring lengths) will create differences in the waveforms to make the timing design difficult. In other words, the following relation in the nearest memory module 102 and the farthest memory module 104 viewed from the memory controller 101 has been an ignorable factor:

(the difference of the lengths of the bus wirings due to the difference of the positions of the sockets)> thickness of the memory module× (number of the sockets−1)

As shown in FIG. 13, in the memory system of the memory modules 102 to 104 of the synchronous DRAM, since the signal from the one memory controller 101 with regard to the signal system common to the modules (address signal: A0 to A11, control signal: /RAS/CAS/WE, data signal: DQ0 to DQ63, data management signal: DQS0 to DQS15, DM0 to DM15) is connected to the bus connecting terminals on the plural boards through a single bus, the lengths of the bus wirings to the memory controller 101 are different with each of the sockets.

In such a signal system common to the modules, with regard to the one-way signals from the memory controller

101 to the memory modules 102 to 104 (address signal, control signal, data management signal) and the clock signal, it is necessary to make the time differences between the clock signal and each of the signals equal to any slots, by regulating the differences of the lengths to the slots.

However, with regard to the data signal that goes and returns, in case of the reverse direction to the clock signal (the readout from the memory modules 102 to 104), it is impossible to synchronize the data signal with the clock signal. That is, there occur shifts in the timings to the clock signal of the data signals for each slot arriving at the memory controller 101. Accordingly, a data strobe signal is required as another synchronization signal. When the data signal reads a data being reverse directional to the clock signal, the data strobe signal also advances in the reverse direction to the memory controller 101 from the memory modules 102 to 104, and serves for transmitting the synchronizing timing of the data signal to the memory controller 101.

With regard to the signal system independent to each module (clock signal: CK0 to CK8, clock management signal: CKE0 to CKE5, bank selecting signal: CS0 to CS5, power supply signal: Vdd, Vss), one signal pin and one bus connecting terminal are connected in a one-to-one correspondence. In the same manner as the common signal system, the signal system independent to each module establishes synchronization with the common signal system by giving differences in the wiring lengths to each of the sockets.

Thus, in the memory system as the premise of this invention, when the memory controller 101 sends a signal to each of the memory modules 102 to 104 as shown in FIG. 14(*a*), with the reflected waves taken into consideration, the signals received by each of the memory modules 102 to 104 become, for example, the waveforms as shown in FIG. 14(*b*). Therefore, it is conceivable that the differences of the distances to each of the memory modules 102 to 104 viewed from the memory controller 101 create the following problems on the bus wirings.

(1) creating the differences of the signal arrival times (skew) due to the differences of the distances to reduce the margin of the timing.

(2) except for the memory module at the termination, the modules have stepped waveforms formed by the times for awaiting the reflected waves; in a signal that defines the timing of a signal with the value of half the amplitude, the timing errors are created to thereby reduce the timing margin. In order to resolve the stepped waveforms, there is a method of connecting a terminating resistor at the termination of the bus line to let the reflected waves loose (escape). But then, the voltage increases by the reflected waves disappear, and there appear the demerits: (1) a decrease of the voltage amplitude, and (2) an increase of the current consumption, which cannot be a desirable method.

Then, the inventor came to an idea to resolve the above problems (1), (2), since, in the memory system using plural memory modules, all the memory modules will attain the waveform similar to that of the memory module (3) in FIG. 14 (*a*) and FIG. 14 (*b*), provided that the distances between each of the memory modules and the memory controller are all equal.

In the Japanese Published Unexamined Patent Publication No.Hei 10(1998)-3971, Hei 11(1999)-40294, Hei 10(1998)-335546, Hei 8(1996)-314800, Hei 4(1992)-144160 as mentioned above, any one of these does not intend to equalize the distances between all the memory modules and the memory controller in order to solve the above problems (1), (2).

It is therefore an object of the present invention to provide a memory system that connects a memory controller to each of plural memory modules in an equal distance through socket pins branched from wirings on a mother board, by a newly-devised structure of a module socket that mounts the plural memory modules.

The above and other objects and novel features of the invention will become apparent from the descriptions and accompanying drawings in this specification.

In accordance with one aspect of the invention, the memory system is a system that connects a memory controller and plural memory modules by way of wirings on a mother board in an equal distance. Using a socket having plural socket pins branched from one point, the memory system connects the wirings on the mother board to each of the plural memory modules, whereby the memory controller is made to connect to each of the memory modules in an equal distance.

In this configuration, each of the memory modules is mounted in a radial form on the mother board by way of the socket pins of the socket, or in parallel to the mother board.

Further, the one point (base point) from which the socket pins of the socket are branched is one point of the wiring on the mother board, or the one point is connected to a wiring on the mother board by way of the wirings inside the socket.

And, of the socket pins of the socket, the pins for an address signal, a control signal, a data signal, and a data management signal are common to each of the memory modules, and the pins for a clock signal, a clock management signal, a bank selecting signal, and a power supply signal are separated with each of the memory modules.

Also, termination resistors are connected to one ends of the wirings on the mother board, or they are connected to both ends of the wirings.

In accordance with another aspect of the invention, the memory system includes a memory controller and plural memory modules connected by way of wirings on a mother board, and satisfies the condition:

difference of a distance between the nearest memory module and the farthest memory module, viewed from the memory controller < (thickness of memory module board+thickness of mounted memory IC)× (number of the memory modules −1).

Thereby, the memory system is able to suppress differences of signal arrival times due to differences of distances, and timing errors by reflected waves.

In accordance with another aspect of the invention, the memory system includes a board, a memory controller laid out on the board, and a socket laid out on the board, on which plural memory modules can be mounted. Thereby, the memory controller is made to connect in an equal distance to each of the plural memory modules to be mounted on the socket.

In accordance with another aspect of the invention, the memory system includes a board, a memory controller laid out on the board, and a connecting member laid out on the board, which includes a first mounting slot having a plurality of first terminals and a second mounting slot having a plurality of second terminals. And, a first memory module can be mounted on the first mounting slot so as to connect a plurality of the first terminals of the first mounting slot to a plurality of a third terminals of the first module, and a second memory module can be mounted on the second mounting slot so as to connect a plurality of the second terminals of the second mounting slot to a plurality of a fourth terminals of the second module. And thereby, a wiring distance between the memory controller and one terminal of a plurality of the first terminals is made to be substantially equal to a wiring distance between the memory controller and one terminal of a plurality of the second terminals corresponding to the one terminal of the first terminals.

In accordance with another aspect of the invention, the memory system includes a board, a control device laid out on the board, having a first terminal, a connecting member laid out on the board, which includes a first mounting part having a second terminal and a second mounting part having a third terminal corresponding to the second terminal. Also, a first memory module can be mounted on the first mounting part, a second memory module can be mounted on the second mounting part, the first memory module has a fourth terminal, the second memory module has a fifth terminal, when the first memory module is mounted on the first mounting part, the second terminal is connected to the fourth terminal, and when the second memory module is mounted on the second mounting part, the third terminal is connected to the fifth terminal. Thereby, the shortest distance of wirings between the first terminal of the control device and the second terminal of the first mounting part is made to be substantially equal to the shortest distance of wirings between the first terminal of the control device and the third terminal of the second mounting part.

Further, the connecting member according to the invention includes a first mounting part having a first terminal, a second mounting part having a second terminal corresponding to the first terminal, and a third terminal. And, a first memory module can be mounted on the first mounting part, a second memory module can be mounted on the second mounting part, the first memory module has a fourth terminal, the second memory module has a fifth terminal corresponding to the fourth terminal, when the first memory module is mounted on the first mounting part, the first terminal is connected to the fourth terminal, when the second memory module is mounted on the second mounting part, the second terminal is connected to the fifth terminal, the third terminal is connected to the first terminal of the first mounting part by a first wiring member, and the third terminal is connected to the second terminal of the second mounting part by a second wiring member, whereby a length of the first wiring member is made equal to a length of the second wiring member.

DETAILED DESCRIPTION OF PREFERRED EMBODIMENTS

Preferred embodiments of the invention will be described in detail with reference to the accompanying drawings. Throughout all the drawings for explaining the embodiments, the same members are given the same symbols so as to avoid repetitive explanations thereof.

[Embodiment 1]

Figure 1:
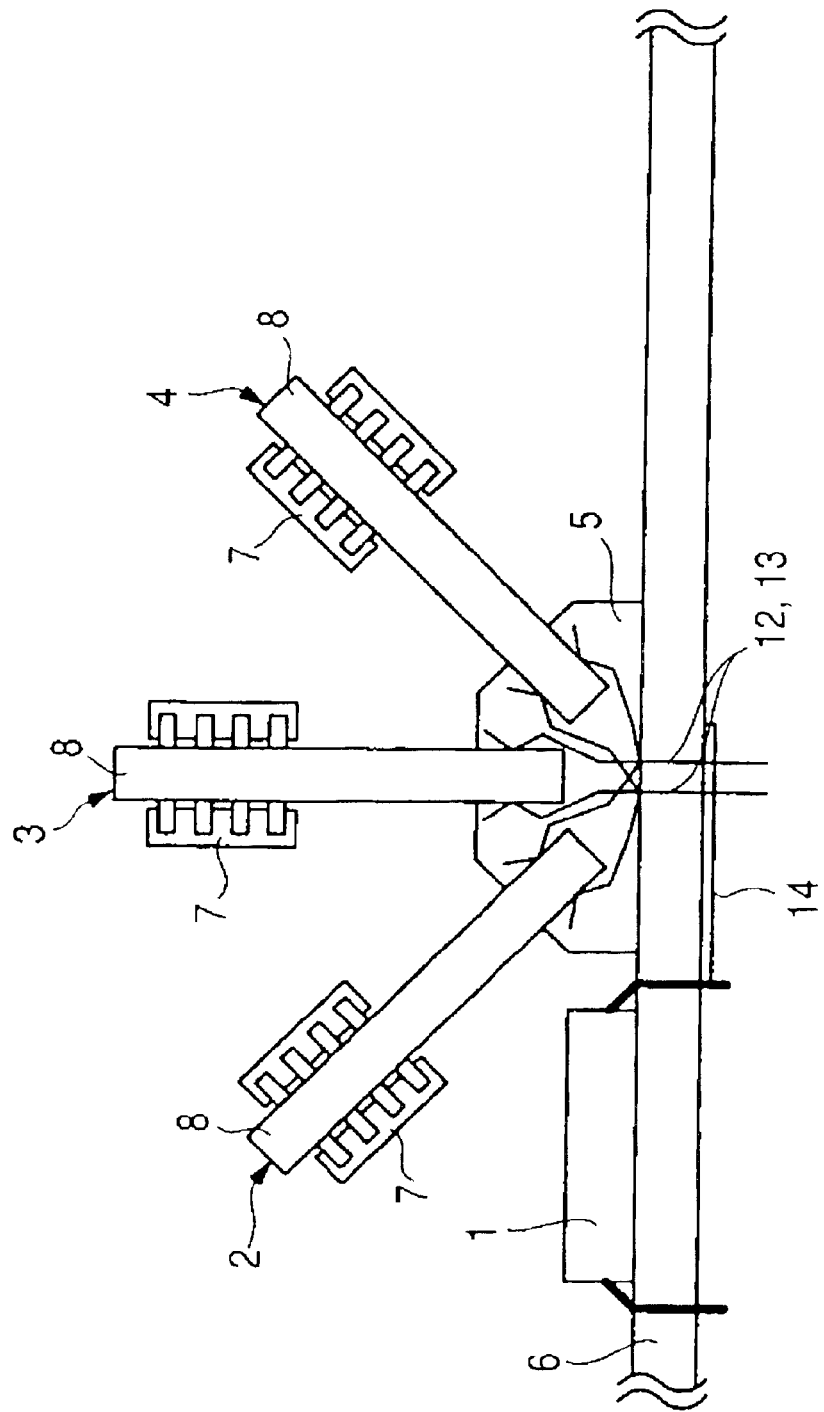
FIG. 1 is a schematic sectional view illustrating a structure of a memory system relating to an embodiment 1 of the invention.
Figure 2:
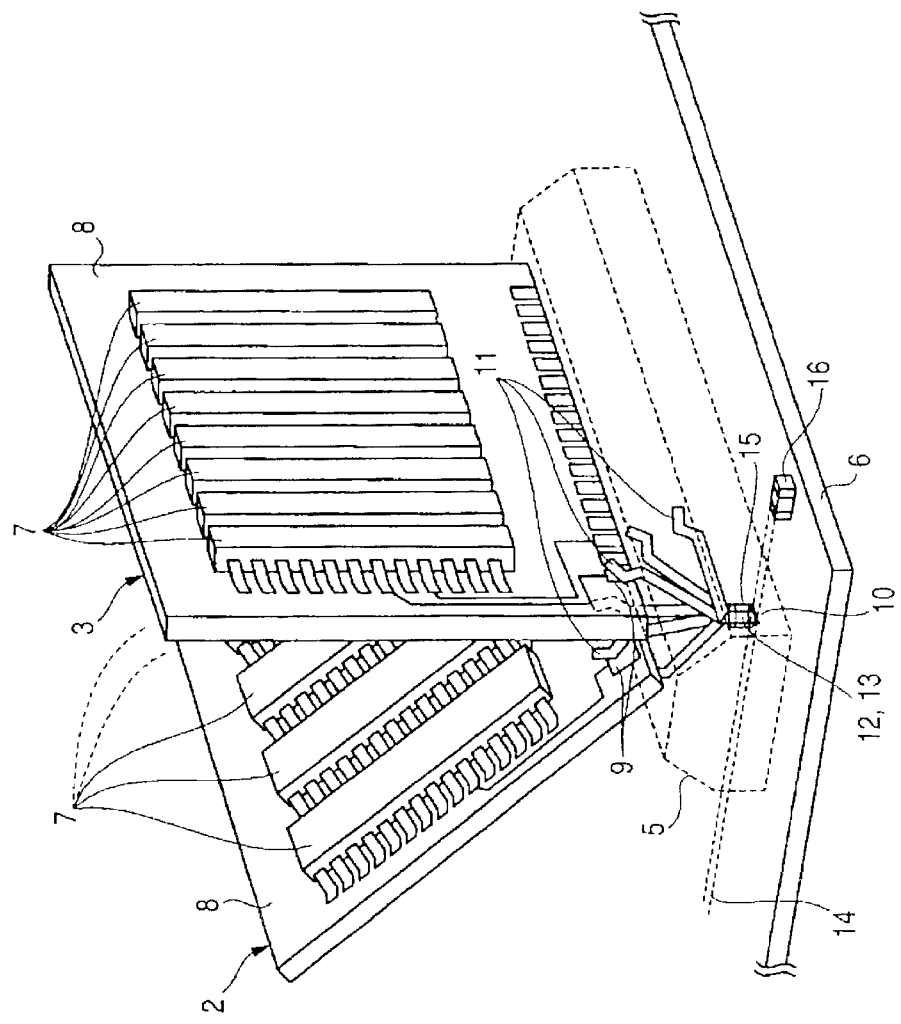
FIG. 2 is a schematic perspective view illustrating a state in which memory modules are mounted on a mother board through a socket, in the memory system relating to the embodiment 1 of the invention.
Figure 3:
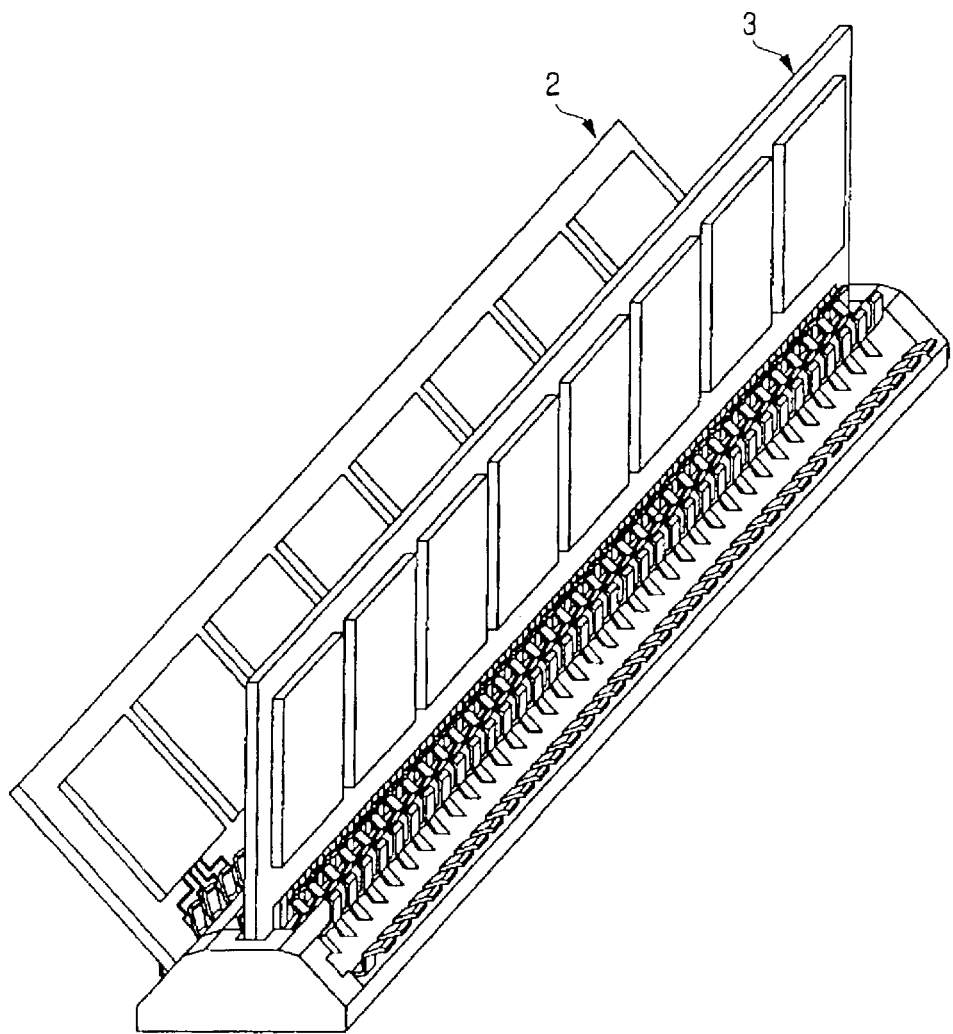
FIG. 3 is an appearance view illustrating a state in which memory modules are mounted on the socket, in the memory system relating to the embodiment 1 of the invention.
Figure 4A:
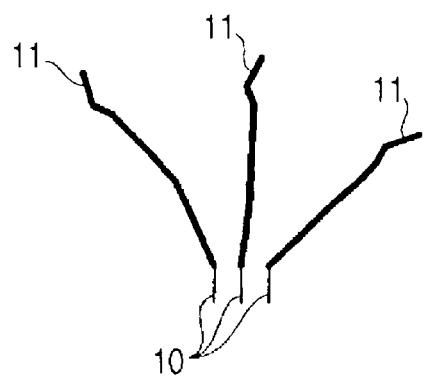
FIG. 4(a) and FIG. 4(b) are schematic sectional views illustrating a pin structure of the socket, in the memory system relating to the embodiment 1 of the invention.
Figure 4B:
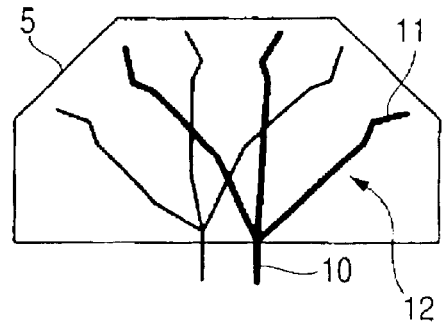
Figure 5:
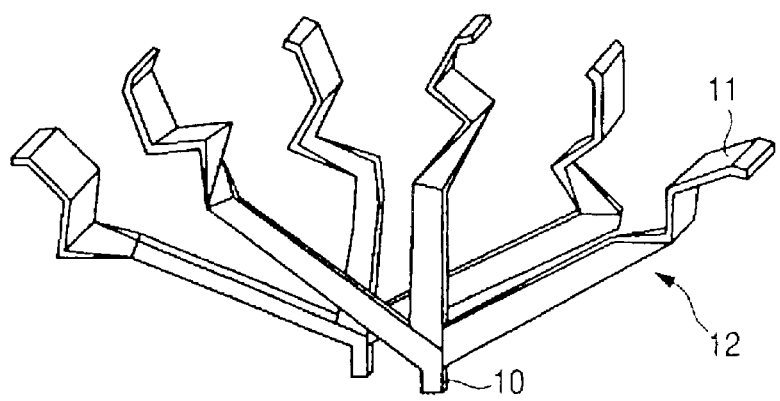
FIG. 5 is an appearance view illustrating a shape of pins, in the memory system relating to the embodiment 1 of the invention.
Figure 6A:
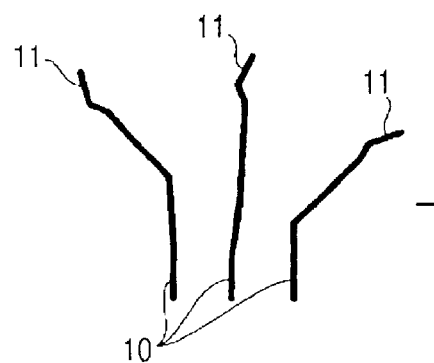
FIG. 6(a) and FIG. 6(b) are schematic sectional views illustrating another pin structure of the socket, in the memory system relating to the embodiment 1 of the invention.
Figure 6B:
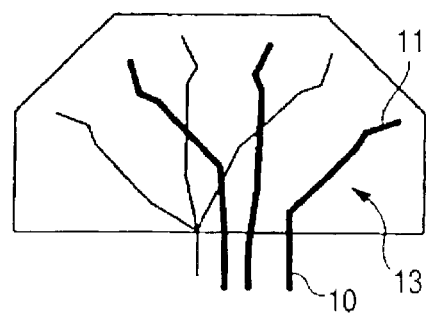
Figure 7:
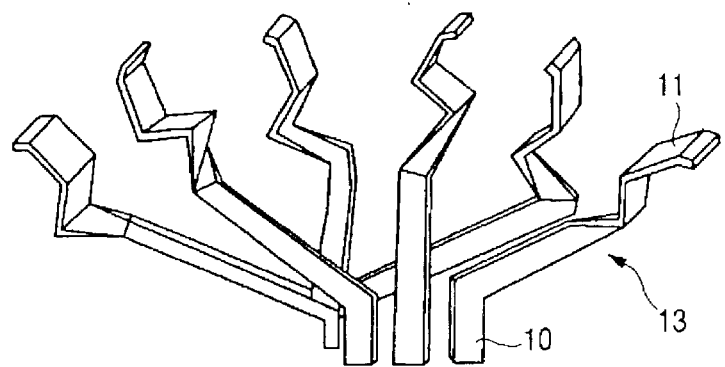
FIG. 7 is an appearance view illustrating another shape of pins, in the memory system relating to the embodiment 1 of the invention.
Figure 8:
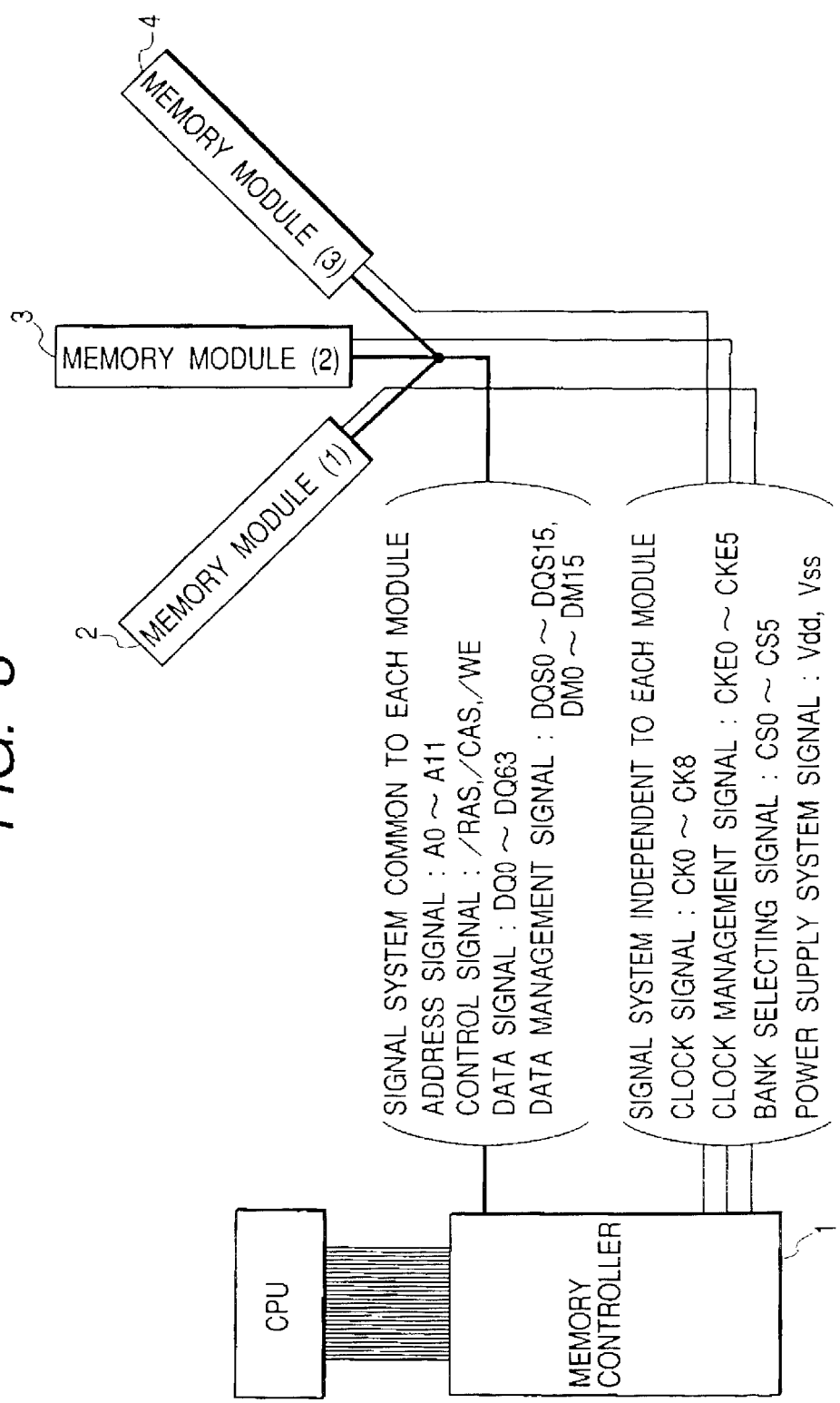
FIG. 8 is an explanatory chart illustrating a signal system of the memory system relating to the embodiment 1 of the invention.
Figure 9:
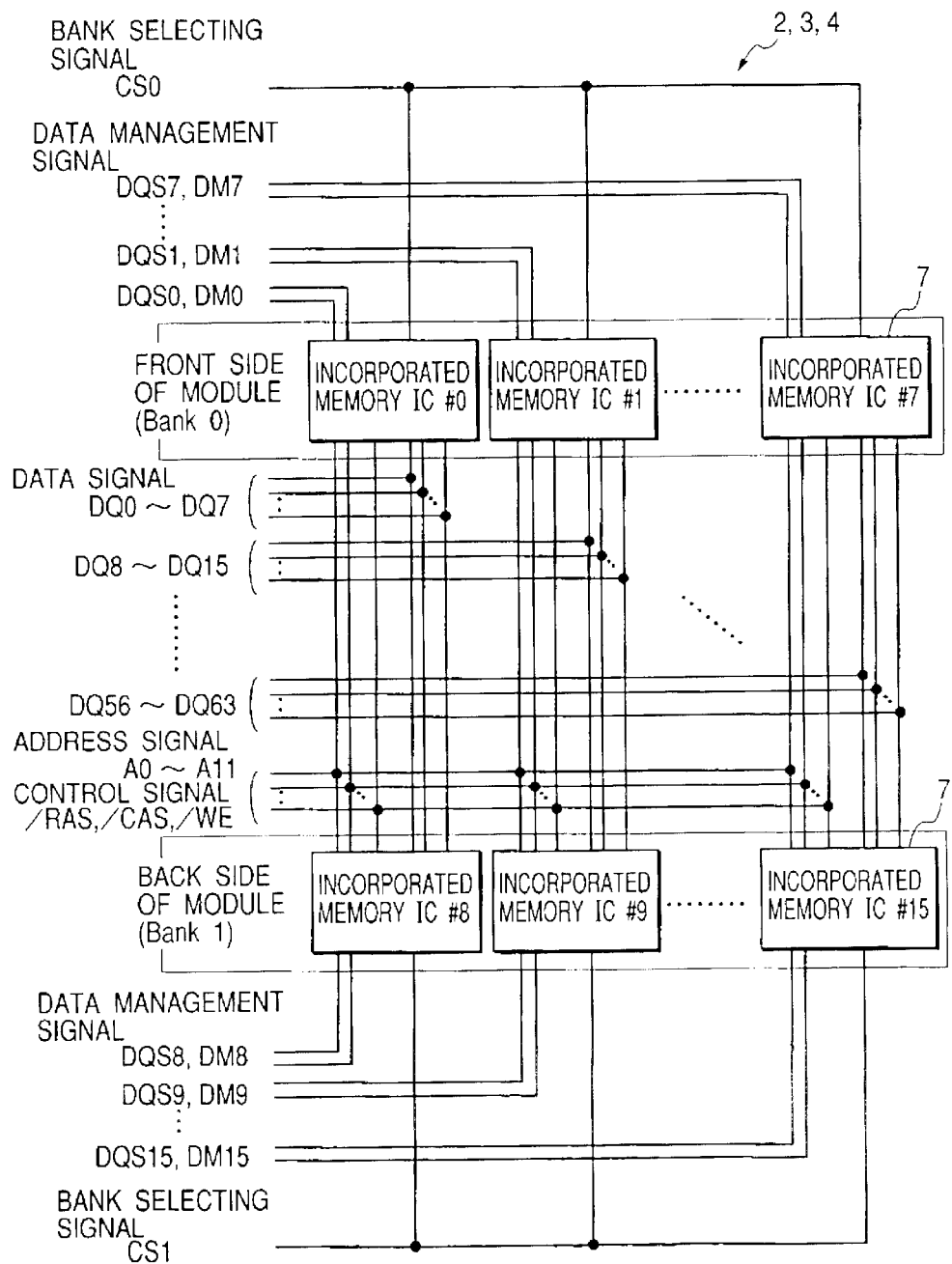
FIG. 9 is an explanatory chart illustrating the internal configuration and signal system of the memory modules, in the memory system relating to the embodiment 1 of the invention.
Figure 15A:
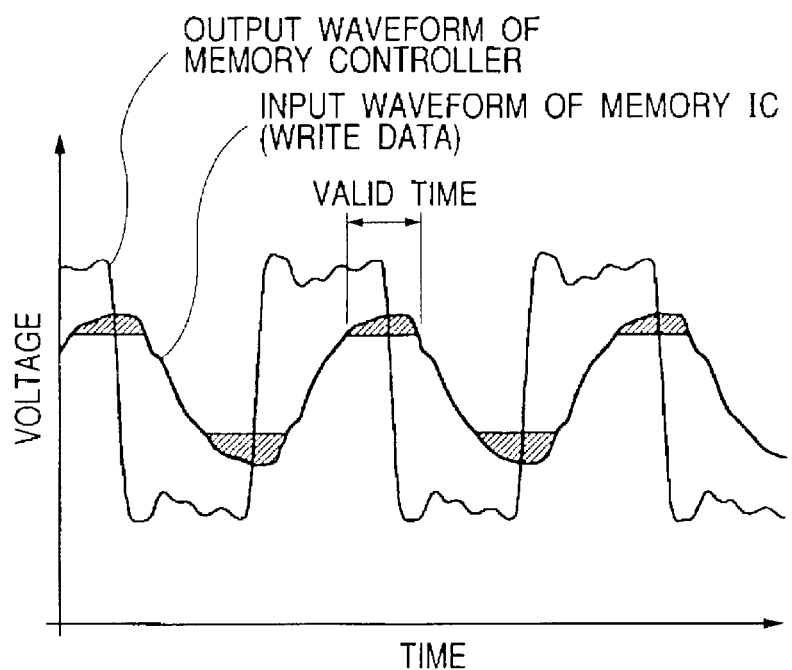
FIG. 15(a) and FIG. 15(b) are waveform charts illustrating the write data to the memory IC, in the memory system relating to the embodiment 1 of the invention.
Figure 15B:
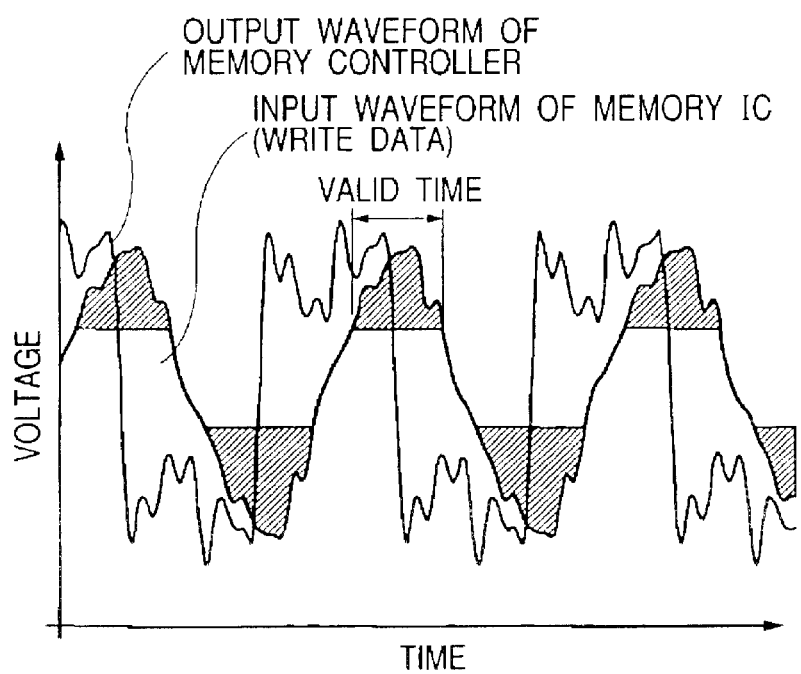

FIG. 1 is a schematic sectional view illustrating a structure of a memory system of an embodiment 1 (the sectional view is omitted on the drawing), FIG. 2 a schematic perspective view illustrating a state in which memory modules are mounted on a mother board through a socket, in the memory system of this embodiment, FIG. 3 an appearance view illustrating a state in which the memory modules are mounted on the socket, FIG. 4(a) and FIG. 4(b) a schematic sectional view illustrating a pin structure of the socket (the sectional view is omitted on the drawing), FIG. 5 an appearance view illustrating a shape of pins, FIG. 6(a) and FIG. 6(b) a schematic sectional view illustrating another pin structure of the socket (the sectional view is omitted on the drawing), FIG. 7 an appearance view illustrating another shape of pins, FIG. 8 an explanatory chart illustrating a signal system of the memory system, FIG. 9 an explanatory chart illustrating the internal configuration and signal system of the memory modules, and FIG. 15(a) and FIG. 15(b) a wave form chart illustrating the write data to the memory IC.

First, a configuration of the memory system of this embodiment will be described with reference to FIG. 1 to FIG. 3. The memory system of this embodiment is defined as a memory system having plural (three, in this example) memory modules mounted thereon. The memory system includes a memory controller 1, three memory modules 2 to 4, a socket 5 which the three memory modules 2 to 4 can be inserted into and pulled out from, and a mother board 6 on which the memory controller 1 and the socket 5 are mounted. And, the memory controller 1 and each of the memory modules 2 to 4 are connected in an equal distance through the socket pins of the socket 5 that are branched from bus wirings on the mother board 6. And in addition, on the mother board 6 is mounted a CPU that is connected to the memory controller 1 through the host bus wiring, and so forth.

The memory controller 1 has a function to control a read/write operation to the memory modules 2 to 4, and is a pin-inserting type chip set LSI to the mother board 6. The data read/write operation to each memory IC of the memory modules 2 to 4 is controlled by the memory controller 1.

Each of the memory modules 2 to 4 includes a module board 8, and for example, 8 pieces of synchronous DRAM memory IC 7 each on the front side and back side of the module board 8, and contacts 9 to connect to socket pins of the socket 5 on the front side and back side of the module board 8. The IC pins of each memory IC 7 of each of the memory modules 2 to 4 are connected to the contacts 9 by way of wirings on the module board 8, and the data read/write is executed to each memory IC7.

The socket 5 is provided with three sets of the plural socket pins in a radial form, in correspondence with each of the memory modules 2 to 4, which forms multi-sockets of a pin inserting type. There are two types of the structure as to the socket pins, as shown in FIG. 4(*a*) and FIG. 6(*a*); one type is an aggregate of the pins having one row of board-bus connections 10 and the other type is an aggregate of the pins having one row of module-board contacts 11. That is, FIG. 4(*b*) and FIG. 5 represent a socket pin 12 being the one type that makes the board-bus connections 10 common to the memory modules 2 to 4, by binding three module-board contacts 11 into one body at one board-bus connection 10; and FIG. 6(*b*) and FIG. 7 represent a socket pin 13 being the other type that separates the board-bus connections 10 with each of the memory modules 2 to 4, and has one module-board contact 11 to one board-bus connection 10.

The mother board 6 is a printed circuit board, on the front side of which, for example, the memory controller 1 and the socket 5 are mounted, and on the back side of which bus wiring 14 is formed. The mother board 6 is pierced through from the front side to the back by way of a via hole 15, and the pins of the memory controller 1 and the socket 5 are inserted from the front to the back, which are electrically connected to the bus wiring 14.

In the memory system thus constructed, the pins of the memory controller 1 and the socket 5 are inserted in the via hole 15 on the mother board 6, whereby the memory controller 1 and the socket 5 are mounted on the mother board 6. Further, three memory modules 2 to 4 are inserted in the socket 5, whereby three memory modules 2 to 4 are connected in a radial form to the mother board 6 and in an equal distance from the bus wirings 14 on the mother board 6.

This memory system satisfies the following relation owing to its structure.

(Difference of the distance between the nearest memory module and the farthest memory module, viewed from the memory controller)< (thickness of memory module board+thickness of mounted memory IC)× (number of the memory modules−1)

Further, in this memory system, the time for awaiting the reflected waves forms the step on the waveform, except for the memory module at the termination. Therefore, in order to set the reflected waves free, this memory system connects a termination resistor 16 to one side or to both the sides of the bus wiring 14.

Next, an example of the signal system of the memory modules 2 to 4 in this memory system will be described on the basis of FIG. 8. This example takes on a two-banks-form synchronous DRAM built-in module having a 64-bits input/output terminal configuration as for each of the memory modules 2 to 4.

(1) Signal System Common to Each Module

The signal system common to each of the memory modules 2 to 4 includes the address signal: A0 to A11, control signal: /RAS/CAS/WE, data signal: DQ0 to DQ63, and data management signal: DQS0 to DQS15, DM0 to DM15, and so forth.

In this signal system common to each of the memory modules 2 to 4, the memory system employs the socket pins 12 with the structure that has three module-board contacts 11 to one board-bus connection 10, as shown in FIG. 4(*a*), FIG. 4(*b*) and FIG. 5. That is, one signal from the memory controller 1 arrives at the one board-bus connection 10 first, and then branches into the three module-board contacts 11 inside the socket 5 to arrive thereat. Therefore, the distances to each of the memory modules 2 to 4 from the memory controller 1 will not be different. Thereby, the wiring lengths to each of the memory modules 2 to 4 from the memory controller 1 will can be made equal, and the signal can be transmitted to each of the memory modules 2 to 4 at the same timing.

(2) Signal System Independent to Each Module

The signal system independent to each module includes the clock signal: CK0 to CK8, clock management signal: CKE0 to CKE5, bank selecting signal: CS0 to CS5, power supply signal: Vdd, Vss, and so forth.

In this signal system independent to each of the memory modules 2 to 4, the memory system employs the socket pins 13 with the structure that has one module-board contact 11 to one board-bus connection 10, as shown in FIG. 6(*a*), FIG. 6(*b*) and FIG. 7, whereby the memory modules 2 to 4 are connected to the bus wirings in one-to-one. Therefore, the wiring lengths from the memory controller 1 to each of the memory modules 2 to 4 can be made equal by adjusting the wiring lengths inside the bus wiring 14 or the socket 5. Thereby, the signal can be transmitted to each of the memory modules 2 to 4 at the same timing. Here, the power supply signal is frequently separated in pursuit of increasing the stability of the power supply, but it can be made common by the socket 5.

Thus, in regard to the signal system common to each of the memory modules 2 to 4, the distances to each of the memory modules 2 to 4 from the controller 1 can be made equal by utilizing the socket 5 in this embodiment. And, in regard to the signal system independent to each of the memory modules 2 to 4, the wiring lengths can be made equal by adjusting the position of the pins of the memory controller 1, or the layout of the bus wirings on the mother board 6. Therefore, the whole signal of each of the memory modules 2 to 4 can be controlled at the timing of a same signal delay. Thereby, it becomes possible to save the data strobe signals that are conventionally required for compensating the signal delay times being different with each of the sockets. Accordingly, this embodiment will achieve the simplification, miniaturization, and cost reduction of the system by simplifying the circuits and reducing the necessary number of signal lines. Naturally, the use of the data strobe signals will enhance the timing accuracy.

Next, an example of the inner configuration and the signal system of the memory modules 2 to 4 in this memory system will be described on the basis of FIG. 9. This example employs a two-banks-form and a double data mode synchronous DRAM built-in module that incorporates 8 pieces of the memory IC 7 being the synchronous DRAM with 8 input/output terminals each on the front and back sides of the module boards, namely, 16 pieces in total.

(1) Address Signal

The address signal (A0 to A11) is a signal to designate an address that is specified by a Row and a Column of a memory matrix composed of plural memory cells disposed in a grid form, inside the synchronous DRAM. This address signal is commonly provided to the synchronous DRAM #0 to #15.

(2) Control Signal

The control signal includes a Row Address Strobe signal (RAS), Column Address Strobe signal (CAS), and Write Enable signal (WE), etc. The Row Address Strobe signal (RAS) is a strobe signal to determine the timing of fetching a row address signal. The Column Address Strobe signal (CAS) is a strobe signal to determine the timing of fetching a column address signal. The Write Enable signal (WE) is a switching signal to switch the write enable mode and the read enable mode. These control signals are commonly provided to the synchronous DRAM #0 to #15, in the same manner as the address signal.

(3) Data Signal

The data signal (DQ0 to DQ63) is an output data in the read enable mode. The data signal (DQ0 to DQ7) is allocated to the synchronous DRAM #0, (DQ8 to DQ15) to the synchronous DRAM #1, . . . , and the (DQ56 to DQ63) to the synchronous DRAM #15, which are separately provided.

(4) Data Management Signal

The data management signal (data strobe signal: DQS0 to DQS15) is a strobe signal to determine the timing of data read. The data management signal (data mask signal: DM0 to DM15) is a mask signal to determine whether to or not to read a data. The data management signal (DQS0, DM0) is allocated to the synchronous DRAM #0 on the front side, (DQS1, DM1) to the synchronous DRAM #1, (DQS7, DM7) to the synchronous DRAM #7; and (DQS8, DM8) is allocated to the synchronous DRAM #8 on the back side, (DQS9, DM9) to the synchronous DRAM #9, . . . , (DQS15, DM15) to the synchronous DRAM #15, which are separately provided.

(5) Bank Selecting Signal The bank selecting signal (chip selecting signal: CS0, CS1) is a signal to select a bank of the memory module. The bank selecting signal CS0 is allocated to the synchronous DRAM #0 to #7 each on the front side, CS1 is allocated to the synchronous DRAM #8 to #15 each on the back side.

In each of the memory modules 2 to 4 thus configured, the memory controller 1 controls the data read/write operation to each memory IC 7 of the synchronous DRAM. First, the address signal (A0 to A11) selects an arbitrary memory cell of a memory matrix of the memory IC 7 #0 to #15. At that moment, the Row Address Strobe signal (RAS), Column Address Strobe signal (CAS), and Write Enable signal (WE) control the various timings; and the bank selecting signals CS0, CS1 select the banks of each of the memory modules 2 to 4.

And, in the write operation to a selected memory cell, the data signal (DQ0 to DQ63) is written in the memory cell as the write data. In the read operation from the selected memory cell, the data signal (DQ0 to DQ63) read from the memory cell is outputted as the read data. At that moment, the timing of data read is determined by the data strobe signal (DQS0 to DQS15) and the data mask signal (DM0 to DM15).

Figure 14A:
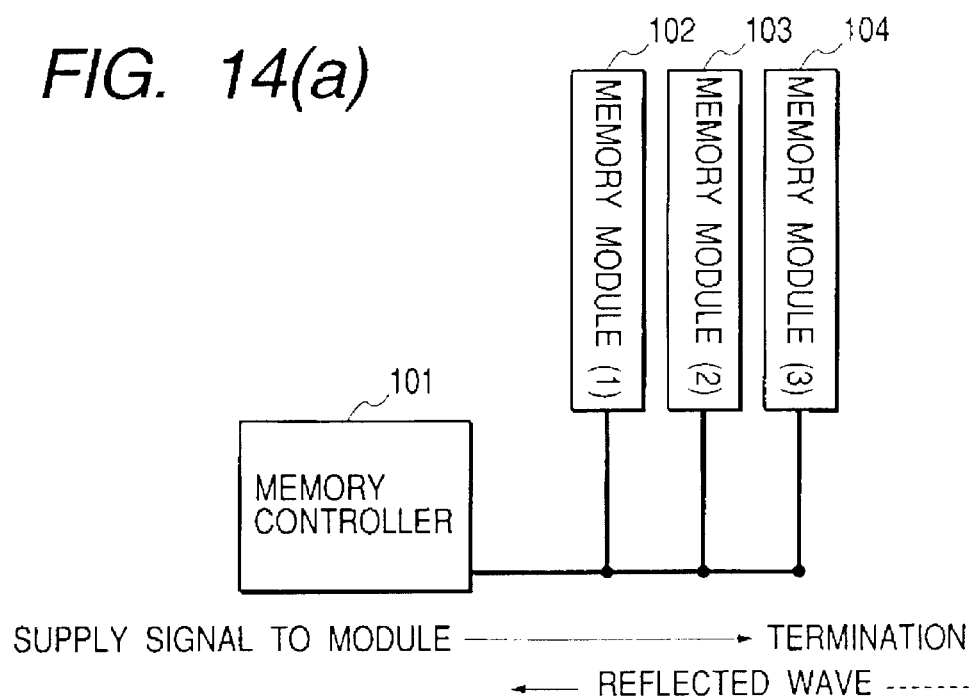
FIG. 14(a) and FIG. 14(b) are explanatory charts illustrating the signal waveform characteristics that the memory modules each receive, in the memory system as the premise of the invention.
Figure 14B:
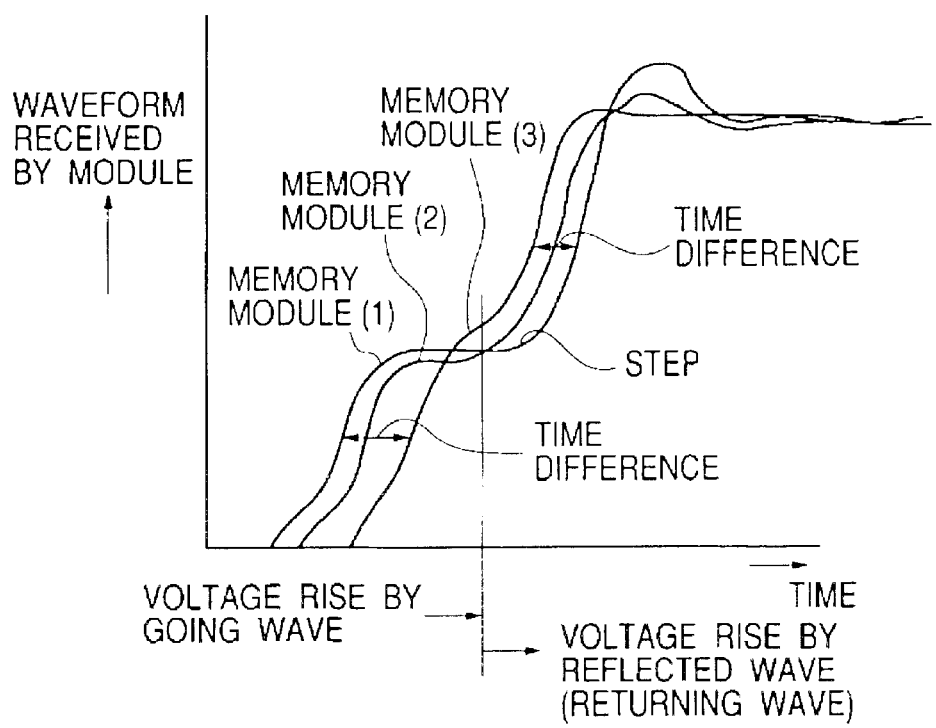

Next, in the memory system of this embodiment, when the memory controller 1 delivers a signal to each of the memory modules 2 to 4, with the reflected waves taken into consideration, if each of the memory modules 2 to 4 is located in an equal distance from the memory controller 1, all the memory modules 2 to 4 will receive the similar waveform to that of the memory module (3) as shown in FIG. 14(*a*) and FIG. 14(*b*). Therefore, the memory system achieves:

(1) restricting the differences of the signal arrival times (skew) due to the differences of the distances to secure the margin of the timing.

(2) letting loose the reflected waveforms that form stepped waveforms, and restricting timing errors as to a signal that defines the timing of a signal with the value of half the amplitude to secure the margin of the timing. And, it is also conceivable to receive the reflected waves from the other modules, but the voltage has already risen by receiving the reflected waves, the influence to the timing is limited.

Further, the memory system of this embodiment achieves shortening and equalizing the wiring lengths inside the socket 5, by gathering the socket pins 12, 13 to the center of the socket 5 in a radial shape, and also reducing the width along the bus direction of the socket 5. Therefore, the memory system exhibits the following effects.

(1) Since it allows the layout of three memory modules 2 to 4 on the bus wiring 14 on the mother board 6 in a single distance from the memory controller 1, the system is able to equalize the lengths of the signal lines to the memory modules 2 to 4 from the memory controller 1, and also able to supply the memory modules 2 to 4 with a signal of the same waveform at the same timing.

(2) Since it suppresses the stepped waveforms by the layout of each of the memory modules 2 to 4 in a single distance from the memory controller 1, the system is able to save the termination resistors for setting free the reflected waveforms being a factor to form the stepped waveforms. Therefore, as the simulation result shown in FIG. 15 ((*a*): with termination resistor, (*b*): without termination resistor), the system is immune to mutual influences from the positional differences of the slots even without the termination resistors, and the waveform of the write data to the memory IC rises/falls sharply; accordingly, the system secures a sufficient amplitude and valid time. As the result, the system reduces the currents consumed across the termination resistors, expands the timing margin by shortening the transit time for the rising/falling of the signal waveform, and also expands the signal voltage margin by the increase of the signal amplitude. Here, instead of eliminating the termination resistors, it is also possible to reduce the number of the termination resistors, or to increase the resistances of the termination resistors.

(3) Since it reduces the number of the sockets 5 mounted on the mother board 6, the system is able to shorten the wiring length to each of the memory modules 2 to 4 from the memory controller 1, which is suitable for a high speed operation.

(4) Since it utilizes the upper area to the surface mounting components such as the memory controller 1 as a space to install the memory modules 2 to 4, the system is suitable for a high-density mounting. Since the memory modules 2 to 4 are placed slant to the mother board 6, the system is able to utilize the slant divided spaces as spaces for mounting the other components to raise the mounting density.

Conventionally, the small package is usually employed in shortening the wiring length for a higher speed, however with the use of the socket 5 of this embodiment, the conventional package will present an effect greater than equal. The output wiring length inside a memory module of the DDP TSOP base, for example, is about 45 mm. On the other hand, adopting the CSP, the length becomes about 22 mm, that is, it diminishes by half. However, the width of the socket is about 7.6 mm even with the duplex type, and in case of mounting four sockets with the highest density, the difference of the bus wiring lengths for each of the sockets becomes 7.6× (4 −1)=22.8 mm, which is virtually the same as the difference of the wiring lengths inside the memory module, resulting from the package type. In other words, the system saves a new package development for a higher speed. Further, in case of an 8-socket product for a server or the like, employment of the socket 5 will shorten the bus wiring length more than development of a new package.

[Embodiment 2]

Figure 10:
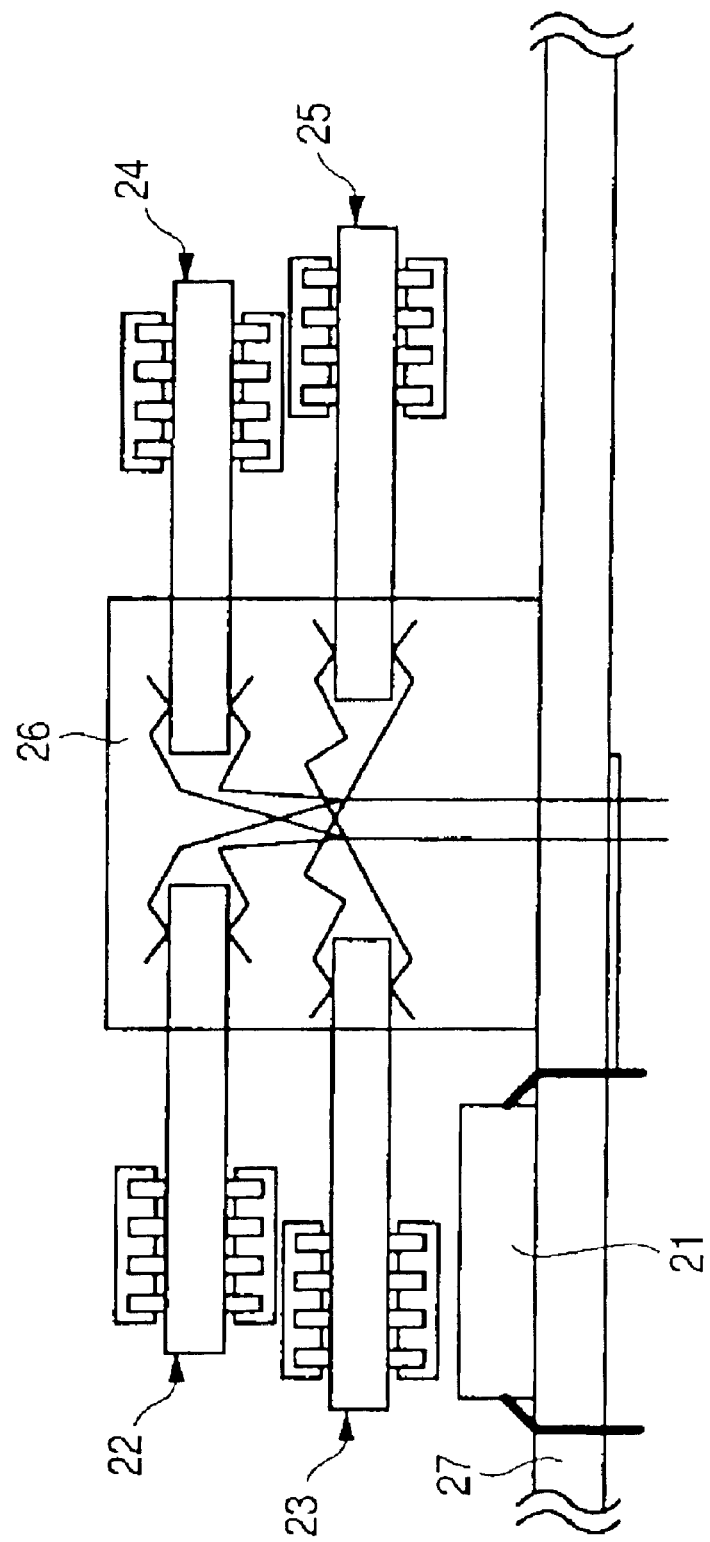
FIG. 10 is a schematic sectional view illustrating a structure of the memory system relating to an embodiment 2 of the invention.

FIG. 10 is a schematic sectional view illustrating a structure of the memory system of an embodiment 2 (the sectional view is omitted on the drawing). The memory system of this embodiment is defined as a memory system having plural memory modules mounted thereon, which is the same as the one in the embodiment 1. The difference from the one in the embodiment 1 lies in modifying a socket structure, whereby the memory modules are mounted not in a radial form, but in parallel to the mother board.

As shown in FIG. 10, the memory system of this embodiment includes a memory controller 21, four memory modules 22 to 25, a socket 26 which the four memory modules 22 to 25 can be inserted into and pulled out from, and a mother board 27 on which the memory controller 21 and the socket 26 are mounted. And, the four memory modules 22 to 25 are mounted in the socket 26 on the mother board 27 with two modules each up and down, so as to be in parallel to the mother board 27.

Therefore, in the memory system of this embedment, while each of the memory modules 22 to 25 are mounted in parallel to the mother board 27, the memory controller 21 and each of the memory modules 22 to 25 are connected in an equal distance through the socket pins of the socket 26 that are branched from bus wirings on the mother board 27; and the memory system achieves the same effect as in the embodiment 1 accordingly. Especially, for a space with a vertically limited height on the mother board 27, the memory system of this embodiment will display the effect to this space for mounting.

[Embodiment 3]

Figure 11:
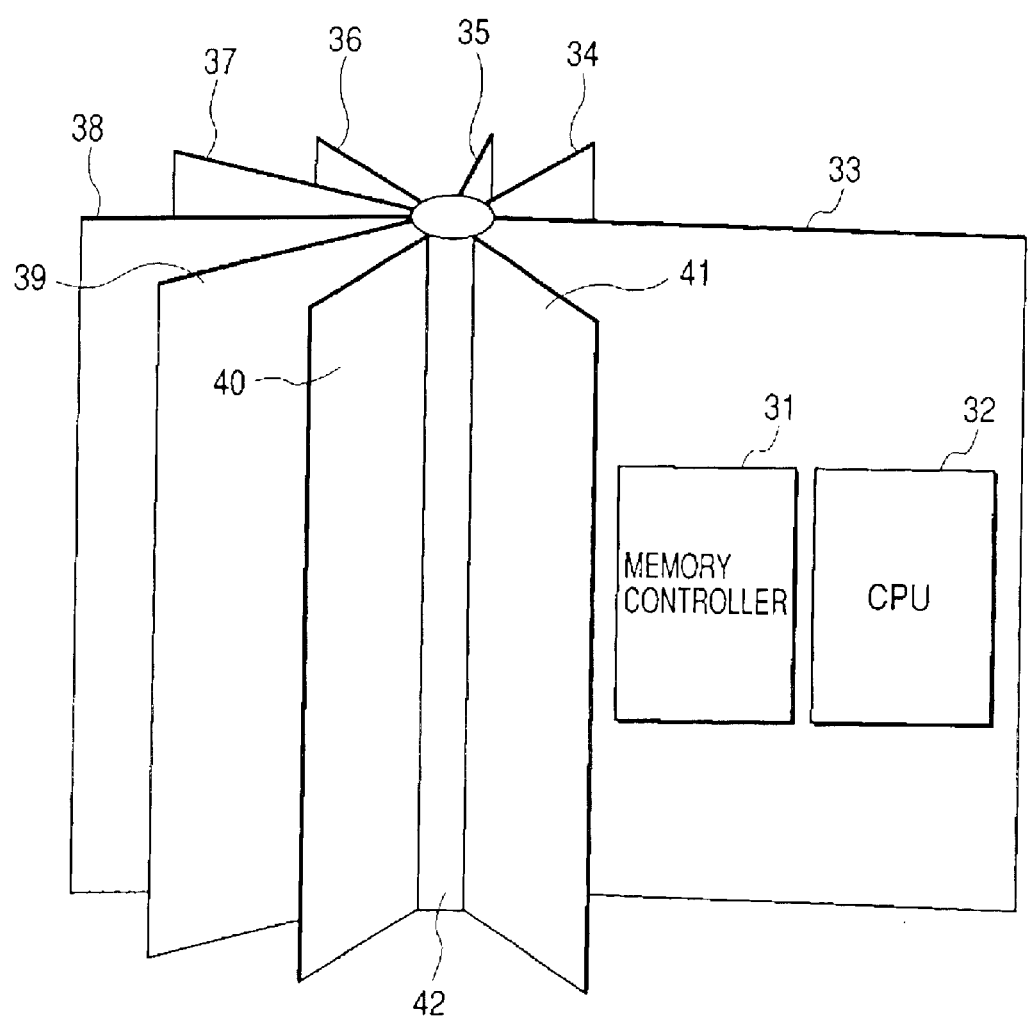
FIG. 11 is a schematic drawing illustrating a structure of the memory system relating to an embodiment 3 of the invention.
Figure 12:
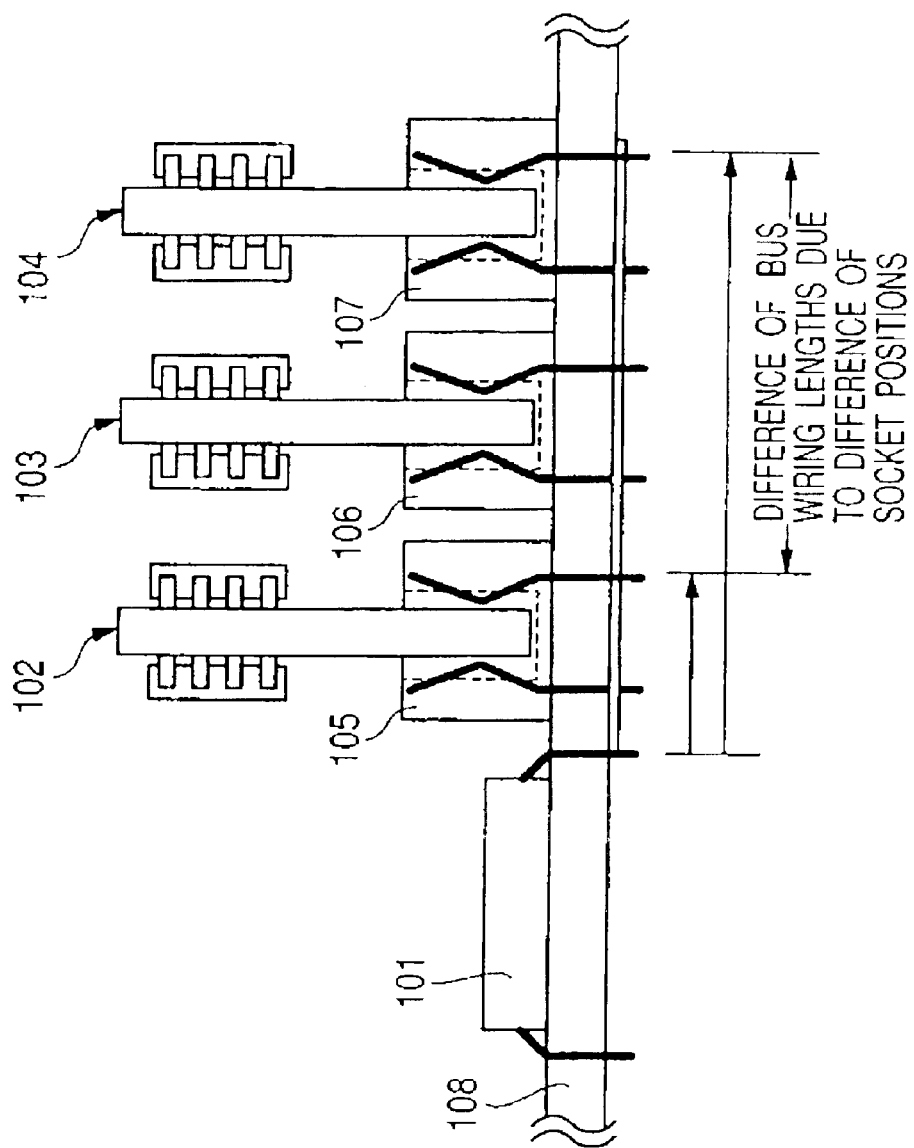
FIG. 12 is a schematic sectional view illustrating a structure of the memory system as the premise of the invention.
Figure 13:
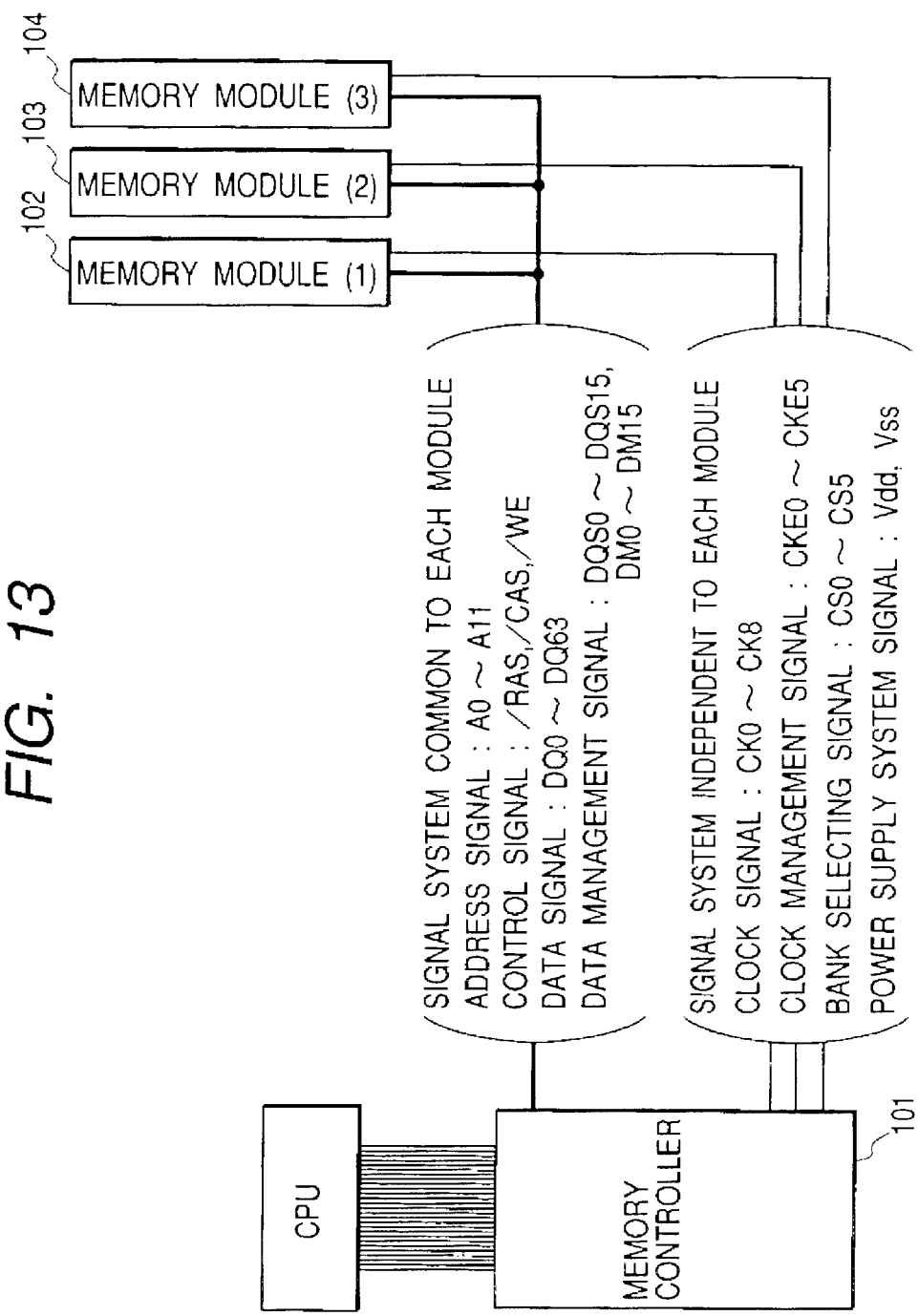
FIG. 13 is an explanatory chart illustrating a signal system of the memory system as the premise of the invention.

FIG. 11 is a schematic sectional view illustrating a structure of the memory system of an embodiment 3. The memory system of this embodiment is defined as a memory system having plural memory modules mounted thereon, which is the same as the one in the embodiment 1 and the embodiment 2, and the difference from the one in the embodiment 1 and the embodiment 2 lies in modifying mother board and socket structures, and using the socket for mounting the memory modules so as to branch the memory modules multiply within the angle of 360° to the mother board.

That is, as shown in FIG. 11, the memory system of this embodiment includes a mother board 33 on which a memory controller 31 and a CPU 32 are mounted, 8 memory modules 34 to 41, a socket 42 which the mother board 33 and the memory modules 34 to 41 can be inserted into and pulled out from. And, the mother board 33 is mounted on a slot of the socket 42, and the memory modules 34 to 41 are mounted on the other slots so as to branch the memory modules 34 to 41 multiply in an equal angle within the angle of 360°.

Therefore, in the memory system of this embedment, while the connecting configurations of the mother board 33 and each of the memory modules 34 to 41 through the socket 42 are different, the memory controller 31 and each of the memory modules 34 to 41 are connected in an equal distance through the socket pins of the socket 42 that is placed on one end of the mother board 33; and the memory system attains the same effect as in the embodiment 1 and embodiment 2. Especially, in this embodiment, by branching the memory modules multiply within the angle of 360° to the mother board 33, it is possible to connect a lot of memory modules to the memory controller 31 in an equal and shortest distance. Since the socket 42 is located on the end of the mother board 33, the mounting number can be increased with the same bus wiring length.

The present invention by the inventor has concretely been described on the basis of the preferred embodiments given herein, however it should be understood that the invention is not limited to the aforementioned embodiments, and various changes and modifications are possible without departing the scope and sprit thereof.

For example, in the embodiment 1, the system may take on two or more than four memory modules instead of three; in the embodiment 2, the system may take on two, three or more than five memory modules instead of four; and in the embodiment 3, the system may take on two through seven or more than nine memory modules instead of eight.

Further, in the foregoing embodiments, the memory system is assumed to take on a two-banks-form synchronous DRAM incorporated module having a 64-bits input/output terminal configuration for each of the memory modules, however the other input/output terminal configurations and the other bank forms can be applicable, and a general purpose DRAM or other memories can be widely adopted.

Furthermore, the memory system of the invention can be applied generally to the system that requires a higher speed of the memory, and it is effective for use in a high-speed disk top PC, a memory board for a high-speed sophisticated server, and so forth. The typical effects achieved by the invention disclosed herein are as follows.

(1) By connecting the wirings on the mother board to the plural memory modules on the module boards with the socket having the plural socket pins that are branched from one point, the memory system shortens and equalizes the wiring lengths inside the socket, also reduces the width along the bus direction of the socket, and thereby enables connecting the memory controller to each of the memory modules in an equal distance.

(2) Since the plural memory modules can be placed in a signal distance from the memory controller with the wirings on the mother board, it becomes possible to input a same waveform signal at a same timing to the plural memory modules.

(3) Since the number of the sockets to be mounted on the mother board can be reduced, and the wiring length from the memory controller to each of the memory modules can be shortened, the memory system is applicable for a high-speed signal.

(4) By mounting each of the memory modules in a radial form on the mother board, the upper area to the surface mounting components on the mother board can be utilized as a space to install the memory modules, and the high-density mounting onto the mother board becomes possible.

(5) Since the stepped waveforms can be reduced by the layout of each of the memory modules in a single distance from the memory controller, it is possible to eliminate the termination resistors for setting free the reflected waveforms being a factor to form the stepped waveforms, or to reduce the number of the termination resistors, or to increase the resistances of the termination resistors. As the result, the system reduces the currents consumed across the termination resistors, expands the timing margin by shortening the transit time for the rising/falling of the signal waveform, and also expands the signal voltage margin by the increase of the signal amplitude.

(6) Satisfying the relation:

(Difference of the distance between the nearest memory module and the farthest memory module, viewed from the memory controller)< (thickness of memory module board+ thickness of mounted memory IC)× (number of the memory modules−1), it is possible to suppress the differences of the signal arrival times due to the differences of the distances, and the timing errors by the reflected waveforms, whereby the timing margin can be secured.

What is claimed is:

1. A memory system which has a memory controller and a plurality of memory modules connected by way of a plurality of wirings on a circuit board comprising a socket having a plurality of socket pins branched from one point, wherein said wirings on said circuit board are connected to each of said plurality of memory modules by using said socket, and wherein said memory controller is connected to each of said plurality of memory modules in an equal distance.

2. A memory system according to claim 1, wherein each of said plurality of memory modules is mounted in a radial form on said circuit board by way of said plurality of socket pins of said socket.

3. A memory system according to claim 1, wherein each of said plurality of memory modules is mounted in parallel to said circuit board by way of said plurality of socket pins of said socket.

4. A memory system according to claim 1, wherein said one point from which said plurality of socket pins of said socket are branched is one point of said wiring on said circuit board.

5. A memory system according to claim 1, wherein said one point from which said plurality of socket pins of said socket are branched is connected to the wiring on said circuit board by way of the wirings inside said socket.

6. A memory system according to claim 1, wherein, of said plurality of socket pins of said socket, the pins for an address signal, a control signal, a data signal, and a data management signal are common to each of said plurality of memory modules, the pins for a clock signal, a clock management signal, a bank selecting signal, and a power supply signal are separated with each of said plurality of memory modules.

7. A memory system according to claim 1, wherein termination resistors are not connected to said plurality of wirings on said circuit board, or they are connected to one ends of said plurality of wirings, or they are connected to both ends of said plurality of wirings.

8. A memory system comprising:

a board, a control device laid out on said board, including a first terminal, a connecting member laid out on said board, which includes a first mounting part having a second terminal and a second mounting part having a third terminal corresponding to said second terminal, wherein a first memory module can be mounted on said first mounting part, wherein a second memory module can be mounted on said second mounting part, wherein said first memory module has a fourth terminal, wherein said second memory module has a fifth terminal, wherein, when said first memory module is mounted on said first mounting part, said second terminal is connected to said fourth terminal, wherein, when said second memory module is mounted on said second mounting part, said third terminal is connected to said fifth terminal, and wherein the shortest distance of wirings between said first terminal of said control device and said second terminal of said first mounting part is equal to the shortest distance of wirings between said first terminal of said control device and said third terminal of said second mounting part.

9. A memory system according to claim 8, wherein both said second terminal and said third terminal are a data terminal.

10. A memory system according to wherein said connecting member comprises a sixth terminal, wherein said board further comprises a first board wiring that connects said first terminal with said sixth terminal, and wherein said connecting member further comprises a first wiring member connected between said sixth terminal and said second terminal, and a second wiring member connected between said sixth terminal and said third terminal.

11. A memory system according to claim 10, wherein a length of said first wiring member is substantially equal to a length of said second wiring member.

12. A memory system according to claim 10, wherein said connecting member is a socket, wherein said first mounting part and said first wiring member constitute a first socket pin, and wherein said second mounting part and said second wiring member constitute a second socket pin.

13. A memory system according to claim 8, wherein, when said first memory module is mounted on said first mounting part and said second memory module is mounted on said second mounting part, said first memory module and said second memory module are laid out in a radial form.

14. A memory system according to claim 8, wherein, when said first memory module is mounted on said first mounting part and said second memory module is mounted on said second mounting part, said first memory module and said second memory module are laid out in parallel.

15. A memory system according to claim 8, wherein said first memory module further comprises a sixth terminal, wherein said second memory module comprises a seventh terminal corresponding to said sixth terminal, wherein said first mounting part further comprises an eighth terminal, wherein said second mounting part further comprises a ninth terminal, wherein, when said first memory module is mounted on said first mounting part, said sixth terminal is connected to said eighth terminal, wherein, when said second memory module is mounted on said second mounting part, said seventh terminal is connected to said ninth terminal, and wherein said control device further comprises a tenth terminal connected to said eighth terminal and an eleventh terminal connected to said ninth terminal.

16. A memory system according to claim 15, wherein said eighth terminal is a terminal to receive a first clock signal, and wherein said ninth terminal is a terminal to receive a second clock signal.

17. A memory system according to claim 15, wherein said eighth terminal is a terminal to receive a first chip selecting signal, and wherein said ninth terminal is a terminal to receive a second chip selecting signal.

18. A memory system according to claim 15, wherein said eighth terminal is a terminal to receive a first clock enable signal, and wherein said ninth terminal is a terminal to receive a second clock enable signal.

19. A memory system according to claim 8, wherein a plurality of dynamic memory chips are mounted on said first memory module and said second memory module.

20. A memory system according to claim 8, wherein said control device is a memory controller.

21. A connecting member comprising a first mounting part having a first terminal, a second mounting part having a second terminal corresponding to said first terminal, and a third terminal, wherein a first memory module can be mounted on said first mounting part, wherein a second memory module can be mounted on said second mounting part, wherein said first memory module has a fourth terminal, wherein said second memory module has a fifth terminal corresponding to said fourth terminal, wherein, when said first memory module is mounted on said first mounting part, said first terminal is connected to said fourth terminal, wherein, when said second memory module is mounted on said second mounting part, said second terminal is connected to said fifth terminal, wherein said third terminal is connected to said first terminal of said first mounting part by a first wiring member, wherein said third terminal is connected to said second terminal of said second mounting part by a second wiring member, and wherein a length of said first wiring member is equal to a length of said second wiring member.

22. A connecting member according to claim 21, wherein said connecting member is a memory module socket.

23. A connecting member according to claim 21, wherein said first mounting part and said first wiring member are a first socket pin, and wherein said second mounting part and said second wiring member are a second socket pin.

24. A connecting member according to claim 21, wherein said connecting member can be laid out on a mounting board.

25. A connecting member according to claim 21, wherein both said first terminal and said second terminal are a data terminal.

* * * * *